United States Patent [19]

O'Connor

[11] Patent Number: 4,777,449
[45] Date of Patent: Oct. 11, 1988

[54] THRESHOLD-EXTENSION FM DEMODULATOR APPARATUS AND METHOD

[76] Inventor: Edward O'Connor, 10212 Plymouth Ave., Cleveland, Ohio 44125

[21] Appl. No.: 53,003

[22] Filed: May 22, 1987

[51] Int. Cl.⁴ .............................................. H03D 3/00
[52] U.S. Cl. ..................................... 329/50; 329/122; 455/207; 455/208; 455/209; 455/263; 455/266
[58] Field of Search ................ 329/50, 122, 140, 168; 358/25, 23, 36; 455/207, 208, 209, 214, 257, 258, 263, 264, 265, 314, 315, 316, 337, 266

[56] References Cited

U.S. PATENT DOCUMENTS

| | | | |
|---|---|---|---|
| 2,279,058 | 4/1942 | Reid | 329/111 X |
| 2,510,906 | 6/1950 | Reid | 455/207 |
| 3,544,899 | 12/1970 | Gusyatinsky et al. | 455/207 |

Primary Examiner—Siegfried H. Grimm

[57] ABSTRACT

A carrier-tracking FM demodulator system for providing threshold extension relative to the demodulation of an FM signal, such as a television signal, is disclosed, wherein an effective system filtering response tracks the instantaneous carrier frequency of the FM signal, without frequency compression, utilizing filters of substantially fixed-tuned characteristics. The waveform fidelity of the demodulated output signal is substantially independent of the action of the carrier-tracking feedback control loop utilized in the demodulator system. In order to track the instantaneous carrier frequency, the invention employs a number of mixer means, in cascade, each of which is utilized in conjunction with a local-oscillator means or other local-carrier-frequency generator means. One or more bandwidth-window filter means is utilized in said cascade for controlling overall bandwidth and one or more product-selector filter means are employed in the cascade to exclude spurious products that may be generated in the mixing processes, which would otherwise be deleterious to FM threshold. A control loop is utilized to provide feedback between the output of a frequency detector means placed behind said cascade and one or more local-carrier-frequency inputs of one or more said local-carrier-frequency generator means. The arrangement of the elements is such that no net frequency shift is produced at said frequency detector, but a shift of overall filtering response is provided which tracks the FM signal with narrow bandwidth. The disclosed demodulator system is particularly suitable for FM signals comprising pulse modulation.

28 Claims, 3 Drawing Sheets

THRESHOLD-EXTENSION FM DEMODULATOR APPARATUS AND METHOD

BACKGROUND OF THE INVENTION

The present invention relates to an FM signal demodulation system and in particular to threshold-extension demodulators for television systems.

It is a known practice to improve the noise C/N (carrier-to-noise) threshold characteristics in the demodulation of an FM signal over those obtainable with conventional frequency-discriminators, such as LC discriminators or delay-line discriminators, by using demodulators operating on a carrier-tracking principle. The prior-art class of carrier-tracking FM demodulators includes the phase-lock FM demodulator, the FM negative-feedback (FMFB) demodulator, and the variable-bandwidth dynamic-tracking (DTVB) demodulator.

In the FMFB type of demodulator, a negative-feedback control loop is utilized between the output of a limiter-discriminator and a voltage-controlled oscillator (VCO) input of a mixer of a downconverter of an FM receiving system, thereby effecting compression of the bandwidth of the input FM signal, the feedback being at video rate, with small loop delay, thus allowing an i.f. filter of narrower bandwidth than the bandwidth of the FM signal to be utilized. Inherent noise is thus deleted, thereby extending noise C/N (carrier-to-noise) threshold relative to the demodulation of the FM signal.

In the DTVB type of demodulator, an adaptive filter, having inputs for varying the center frequency of the filtering response of the adaptive filter, in response to a control-loop feedback signal, and for varying the bandwidth of the filter, in response to the strength of the FM signal, is utilized in conjunction with a limiter-discriminator; having an input coupled to be responsive to the FM signal and having an output coupled to an input of the limiter-discriminator. The feedback is utilized between the output of the limiter-discriminator and the input of the adaptive filter for varying the center frequency of the filter. The feedback is arranged, via appropriate scaling, offsetting and polarity selection of the output signal of the limiter-discriminator, to cause the center frequency, or the bandwidth window of the filtering response of the adaptive filter, to track, or substantially track, the instantaneous carrier frequency of the FM signal. The bandwidth of the adaptive filter is made less than the bandwidth of the FM signal, thereby deleting inherent noise and extending noise C/N threshold. The bandwidth of the adaptive filter is controlled by the bandwidth-controlling input according to the signal level detected by a detection means so that the bandwidth is narrow when the signal level is low, and the bandwidth is wide when the signal level is high. The detection means may be coupled to be responsive to the level of the signal or a component of the signal, such as the color subcarrier level.

However, prior-art carrier-tracking FM demodulators such as the above, for satellite television or other FM microwave video signals, have heretofore required critical feedback loops or difficult-to-design adaptive filters.

SUMMARY OF THE INVENTION

It is an object, therefore, of the present invention to overcome the disadvantages and limitations of prior-art FM demodulation systems, particularly for pulse-type signal demodulation, by providing a new and improved FM signal demodulation system.

The present invention relates to a threshold-extension FM demodulator system having properties intermediate to the FMFB and DTVB types of demodulators, and having advantages not heretofore exhibited by carrier-tracking FM demodulators.

The improved FM demodulator system disclosed herein operates by utilizing a number of mixer means, operating on the heterodyne principle, in cascade, in conjunction with a frequency detector means, which may in some cases be a limiter-discriminator type of frequency detector means, but in other cases may be some other known type of frequency detector means such as a quadrature detector, etc. Each of the cascaded mixers, a first of which is coupled to be responsive to the FM signal, is utilized in conjunction with a local-oscillator means or other local-carrier-frequency generator means. The cascaded mixer means are part of a cascade of elements of the FM demodulator system according to the present invention, and other elements may be included in said cascade. Said frequency detector means is an element of said cascade, having an input to which an output of a last of said mixer means is coupled. One or more bandwidth-window filter means, having substantially fixed center frequencies, are also utilized in the cascade, said bandwidth-window filter means being located at one or more intermediate points of said cascade, to control instantaneous overall bandwidth, said bandwidth-window filter means in some cases being adaptive filter means having inputs for providing bandwidth variation in response to signal strength or other signal parameters. A control loop is utilized to provide feedback between the output of the frequency detector means and one or more local-carrier-frequency (LCF) inputs of one or more local-carrier-frequency-generator (LCG) means. The arrangement of the elements of the cascade and their associated LCG means is such that no net frequency shift is produced of the converted instantaneous carrier frequency of the FM signal, at the input of said frequency detector means, regardless of the operation relative to the feedback signal; however, said feedback signal nevertheless produces a shift in the overall filtering response of the cascaded mixer means and filter means of said cascade, which acts on the converted FM signal, at the input of said frequency detector means. The control loop is arranged to cause the shifting overall filtering response of the cascade elements preceeding the frequency detector means to substantially track the instantaneous carrier frequency of the FM signal.

To properly obtain the above-indicated tracking of the input FM signal, it is necessary to additionally include in said cascade of elements one or more product selector filter means, acting to select desired mixer products, i.e., sum or difference, comprising desired polarities of frequency shifts consequent to said feedback, at the outputs of appropriate mixer elements of the aforementioned cascade; and said feedback must act on the LCF inputs of two or more mixer means, as will be described in detail hereinafter.

Thus, similarly to the aforementioned DTVB demodulator, a filtering response is produced which may, with appropriate feedback arrangement, be made to track the instantaneous carrier frequency of an FM signal. However, only fixed-center-frequency filter means are required, thus simplifying design, and allowing, for example, the elimination of varactors, and the attainment of higher filter Q's. Response of the filter means can then be optimized, while with the prior-art DTVB, filter design is difficult, and a compromise single-pole, low-Q response is often required, to allow center-frequency tuning in a realizable filter design. Advantageously, for signals of relatively low C/N ratio, it is also possible to reduce the amount of signal non-linearity in the filter means, by eliminating signal-non-linear tuning elements, e.g., varactors, thus desirably reducing the amount of cross-modulation between input FM signal frequency components and inherent noise components.

As heretofore indicated, a said bandwidth-window filter means may be made adaptive with respect to bandwidth, since complete frequency compression tends to be exhibited with regard to the input signals of said bandwidth-window filter means; i.e., at d.c. modulation frequencies, said bandwidth-window filter means could be made sufficiently narrow so as to pass substantially only one frequency, if tracking were ideal. Of course, since modulation is at higher than d.c. rates, a non-zero bandwidth is required, even with ideal tracking. Although such as adaptive filter is slightly more difficult to design than a completely fixed-tuned filter, it is considerably easier to design than one requiring center-frequency variability, especially if high component Q's, optimized efficiency, or optimized response-curve shape is required. The bandwidth of the aforementioned product selector means, on the other hand, will generally be predetermined, since generally no frequency compression occurs with regard to the input signals of said product selector means.

As will be shown, the improved FM demodulator system according to the present invention has a similarity to the FMFB demodulator in that a frequency compression occurs relative to a fixed-center-frequency filter means. However, frequency compression does not occur at the input to the frequency detector means. Thus, waveform fidelity is improved, particularly with regard to pulse-type modulation, since the instantaneous frequency reaching the FM detector means is the same as the instantaneous carrier frequency of the FM signal, or is an up-converted or down-converted analog of said carrier frequency, while in the prior-art FMFB, the instantaneous frequency reaching the FM detector means, and hence the output waveform quality, is critically dependent on the action of the feedback control loop, in regard to overshoot, etc. Even if the instantaneous-carrier-frequency tracking of the shifting overall filtering response were not ideal, no distortion of the instantaneous frequency reaching the FM detector means would be exhibited, in the operation of the improved FM demodulator system according to the present invention.

DESCRIPTION OF THE PREFERRED EMBODIMENT

Figure 1:
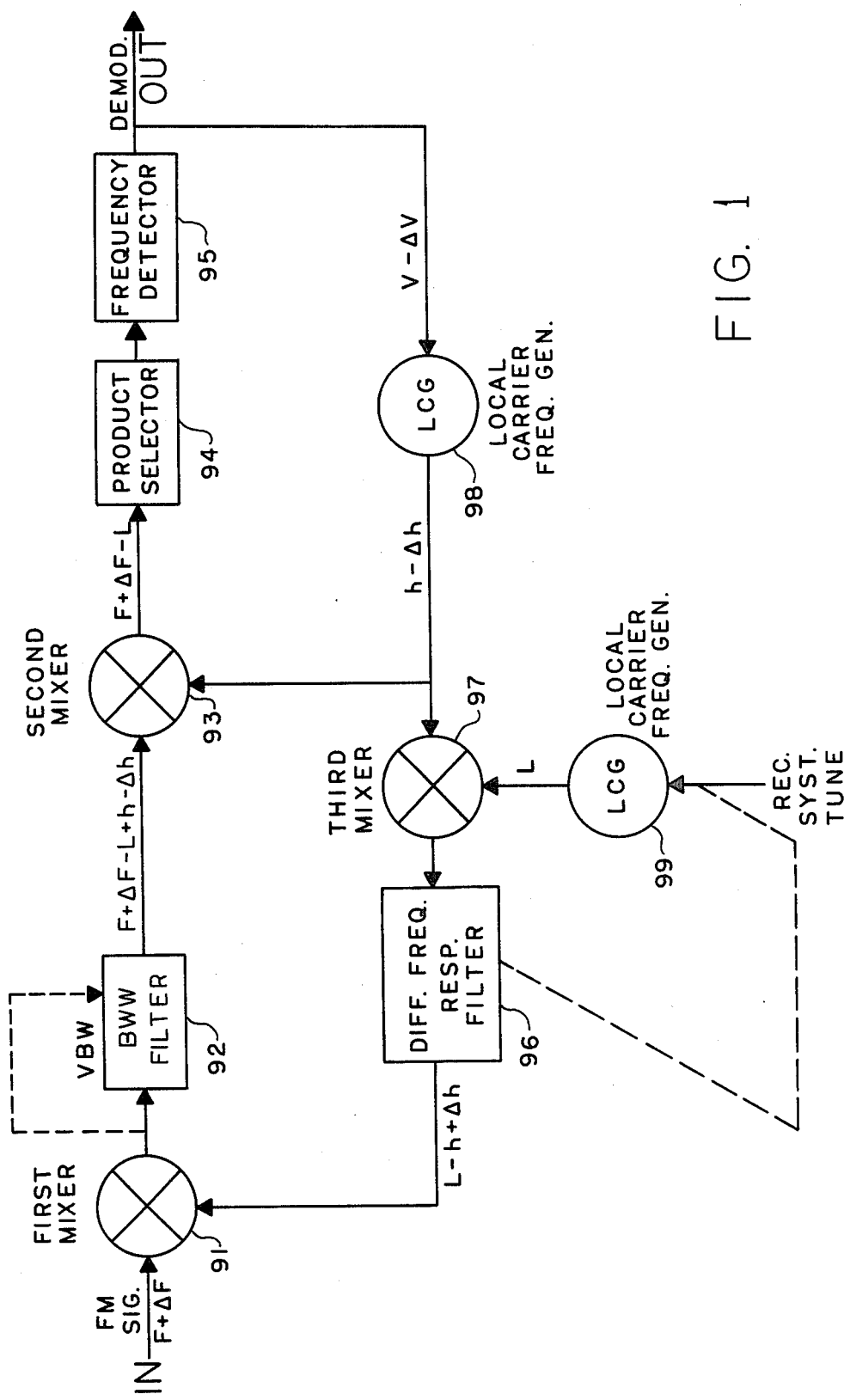
FIG. 1 is a block diagram of an embodiment of the demodulator according to the present invention.

Referring to FIG. 1, a preferred embodiment of the demodulator includes a first mixer means 91, having a signal input to which the FM signal is coupled, a local carrier frequency (LCF) input coupled to an output of a difference-frequency-responsive filter means 96, and an output coupled to the input of a bandwidth-window filter means 92. Said filter means 92 includes an output coupled to an input of a second mixer means 93, which in addition has a LCF input coupled to an output of a local carrier frequency generator (LCG) means 98, and an output coupled to an input of a product selector filter means 94, which has an output coupled to an input of a frequency detector means 95, from an output of which a demodulated output signal is coupled. LCG means 98 also has a frequency-controlling input coupled to said output of said frequency detector means 95. Difference-frequency-responsive filter means 96 has an input coupled to an output of a third mixer means 97, which also includes a signal input coupled to said output of said LCG means 98, and a LCF input coupled to an output of LCG means 99, which also has an input designated as Receiving System Tune. Said bandwidth-window filter means 92 may in alternate preferred embodiments be an adaptive filter means including an input, designated VBW in FIG. 1, for varying the bandwidth of the filtering response of said filter means 92, in response to an appropriate signal parameter, e.g., signal strength. This bandwidth-varying input VBW is shown in an illustrative sense as being coupled to an output of said first mixer means 91, although it may actually be coupled to any point at which signal strength may be sensed, via an appropriate signal-strength detecting means (not shown).

Now, the embodiment of the present invention is described in more detail.

In operation, said LCG means 98, which may in some embodiments be a voltage-controlled oscillator, but which may in alternate preferred embodiments be any type of LCG source known in the art, e.g., a frequency synthesizer, a frequency converter, a BFO type of frequency generator, or other frequency source, has a center frequency h which may be shifted by an amount $(-\Delta h)$ by a feedback signal component $(-\Delta V)$ of a feedback signal $V-\Delta V$ from said output of said frequency detector means 95. The frequency $h-\Delta h$ mixes in said third mixer means 97 with a frequency L provided by LCG means 99, to provide a difference frequency $L-h+\Delta h$, which is passed by difference-frequency-responsive filter means 96. Said LCG means 99 may, analogously to the heretofore-mentioned LCG means 98, in some embodiments be a voltage-controlled-oscillator means, but in other preferred embodiments may also be a frequency synthesizer or other frequency-controlled source, controlled by the previously-mentioned tuning signal designated as Receiving System Tune, which serves to tune the system to the center frequency F of said FM signal. The instantaneous carrier frequency $F+\Delta F$ of said FM signal mixes with said frequency $L-h+\Delta h$ to provide a difference frequency $F+\Delta F-L+h-\Delta h$, which is passed by said bandwidth-window filter means 92 when said frequency falls within the bandpass window of said filter means 92, having center frequency substantially equal to $F-L+h$. Said difference frequency mixes with said frequency $h-\Delta h$ in said second mixer means 93 to provide a mixer product difference frequency $F+\Delta F-L$ which is passed by said product selector means 94, to said input of frequency detector means 95. When L is a constant frequency when the system is tuned to a desired signal, the frequency $F+\Delta F$ is converted to the frequency $F+\Delta F-L$ regardless of the signal $(-\Delta V)$, so that there is no net shift of any frequency component of said FM signal resulting from the feedback derived from said output of said frequency detector means 95. Typically, the center frequency of bandwidth-window filter means 92, which has a substantially fixed center frequency, will be less than said center frequency F of said FM signal and typically also said frequency h will be less than said frequency L. The center frequency of said difference-frequency-responsive means 96 may be maintained, in some embodiments, in tracking relationship with said output frequency L of said means 99. It will be appreciated that as the instantaneous value of the carrier frequency $F+\Delta F$ of the said FM signal varies, $\Delta h$ can be arranged to vary so that the frequency $F+\Delta F-L+h-\Delta h$, or $(\Delta F-\Delta h)+(F-L+h)$, remains constant or substantially constant, thus remaining within the bandwidth window of said bandwidth-window filter means 92, by appropriate scaling, off-setting and selection of polarity of the output signal of said frequency detector means 95 to derive the feedback signal $(-\Delta V)$, in such a way that the frequency shift $(-\Delta h)$ substantially counters the frequency shift $\Delta F$. Thus the bandwidth of bandwidth-window filter means 92 can be made narrow, consistent with the constraints of the maximum modulation frequency of said FM signal, and/or the strength of said FM signal. It will be appreciated, however, that for the mixer product $(\Delta F-\Delta h)+(F-L+h)$ to remain centered, or at least within, the bandpass window of said filter means 92, having center frequency substantially equal to F-L+h, said feedback must maintain the term $(\Delta F-\Delta h)$ at a sufficiently low value; otherwise the frequency $F+\Delta F$ would be converted by mixer means 91 to a different point on the frequency-response curve of filter means 92, or to a point in a reject band of said filter means 92. This indicates that the bandpass window of the overall filtering response of the system, from said input of said first mixer means 91 to the input of said frequency detector means 95, substantially tracks the instantaneous carrier frequency of said FM signal, in response to said feedback, while the bandwidth of said overall filtering response may be maintained constant, or may be rendered responsive to a parameter of the signal, such as signal strength, by varying the bandwidth of bandwidth-window filter means 92, as heretofore indicated. Said bandwidth window may be made narrower than the bandwidth of said FM signal. Thus inherent noise may be rejected relative to the carrier of said FM signal, thereby effecting extension of noise C/N threshold relative to the demodulation of said FM signal.

Figure 2:
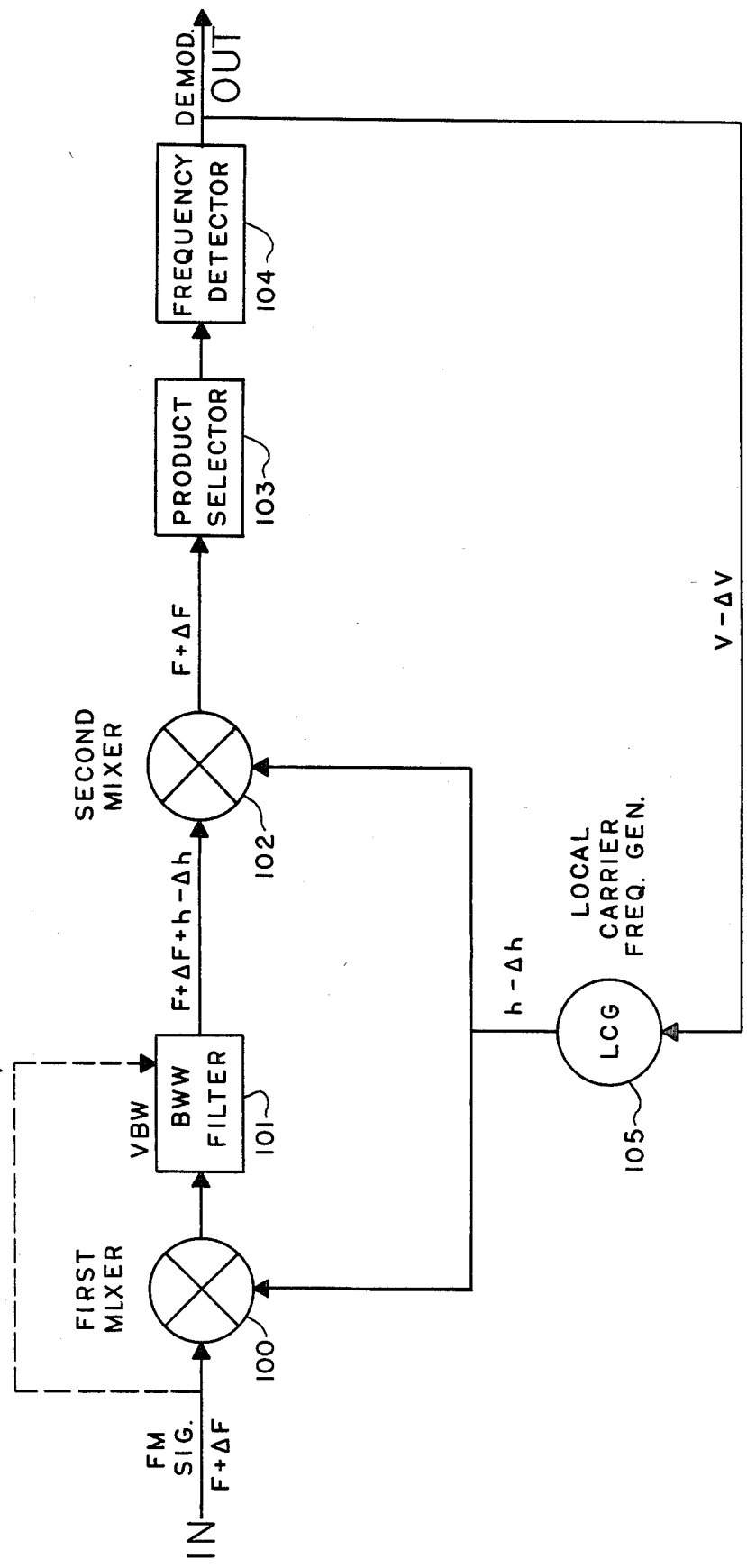
FIG. 2 is a block diagram of a second embodiment of the demodulator in accordance with the present invention.

Referring now to FIG. 2, an alternate preferred embodiment of the demodulator according to the present invention includes a first mixer means 100, having a signal input coupled to be responsive to the FM signal, an LCF input coupled to the output of a LCG means 105, and an output coupled to a signal input of a bandwidth-window filter means 101. Bandwidth-window filter means 101 includes an output coupled to a signal input of a second mixer means 102, which also has a LCF input coupled to an output of the aforesaid LCG means 105, and an output coupled to an input of product selector means 103, which has an output coupled to an input of frequency detector means 104, from an output of which a demodulated output signal is coupled. LCG means 105 also includes a frequency-controlling input coupled to said output of frequency detector means 104. Analogously to the aforementioned bandwidth-window filter means 92 of FIG. 1, bandwidth-window filter means 101 may, in alternate preferred embodiments, be an adaptive filter means including an input, designated VBW in FIG. 2, for varying the bandwidth of the filtering response of said filter means 101, in response to, for example, signal strength.

Now, the embodiment of the present invention is described in more detail.

In operation, said LCG means 105, which is an LCG means analogous to the aforementioned LCG means 98 of FIG. 1, has a center frequency h which may be shifted by an amount $(-\Delta h)$ by a feedback voltage component $(-\Delta V)$ of the feedback signal $V-\Delta V$ derived from said output of said frequency detector means 104. The frequency $h-\Delta h$ mixes in said first mixer means 100 with the frequency $F+\Delta F$ of the FM signal to provide a sum frequency $F+\Delta F+h-\Delta h$, which is passed by said bandwidth-window filter means 101 when said sum frequency is within the bandpass window of said filter means 101, having a center frequency substantially equal to F+h. Said sum frequency mixes with said frequency $h-\Delta h$ in said second mixer means 102 to provide a difference frequency $F+\Delta F$, which is passed by said product selector means 103, which, analogously to the aforementioned product selector means 94 of FIG. 1, is a filter means designated herein as a said product selector means, to said input of said frequency detector means 104. Analogously to the heretofore-described embodiment of FIG. 1, the input signal frequency $F+\Delta F$ is converted to the frequency $F+\Delta F$, regardless of the feedback signal component $(-\Delta V)$, so that there is no net shift of frequency of any frequency component of said FM signal, resulting from said feedback signal, at said input of said frequency detector means 104. The center frequency of said bandwidth-window filter means 101 is, of course, substantially fixed, although in some embodiments the bandwidth of said means 101 may, as heretofore indicated, be variable.

It will be appreciated, analogously to the heretofore-described embodiment of FIG. 1, that as the instantaneous value of the carrier frequency $F+\Delta F$ of the said FM signal varies, $\Delta h$ can be arranged to vary so that the frequency $F+\Delta F+h-\Delta h$, or $(\Delta F-\Delta h)+(F+h)$, remains constant or substantially constant, thus remaining within the bandpass window of said bandwidth-window filter means 101, by appropriate offsetting, scaling and selection of polarity of the output signal of said frequency detector means 104, to derive the feedback signal component $(-\Delta V)$, in such a way that the frequency shift $(-\Delta h)$ substantially counters the frequency shift $\Delta F$. Thus the bandwidth of said bandwidth-window filter filter means 101 can be made narrow, consistent with the constraints of the maximum modulation frequency of said FM signal, and/or the strength of said FM signal.

It will be further appreciated, however, that for the mixer product $(\Delta F-\Delta h)+(F+h)$ to remain centered, or at least within, the bandpass window of said bandwidth-window filter means 101, having center frequency substantially equal to F+h, said feedback must maintain the term $(\Delta F-\Delta h)$ at a sufficiently low value; otherwise the frequency $F+\Delta F$ would be converted by mixer means 100 to a different point on the frequency-response curve of said filter means 101, or to a point in a reject band of said filter means 101. This indicates that the bandpass window of the overall filtering response of the system, from said input of said first mixer means 100 to the input of said frequency detector means 104, substantially tracks the instantaneous carrier frequency of said FM signal, in response to said feedback, while the bandwidth window of said overall filtering response may be maintained constant, or may be rendered responsive to an appropriate signal parameter such as signal strength, by varying the bandwidth of said bandwidth-window filter means 101, as heretofore indicated. Said bandwidth may be made narrower than the bandwidth of said FM signal. Thus inherent noise may be deleted relative to the carrier of said FM signal, thereby effecting extension of noise C/N threshold relative to the demodulation of said FM signal.

Figure 3:
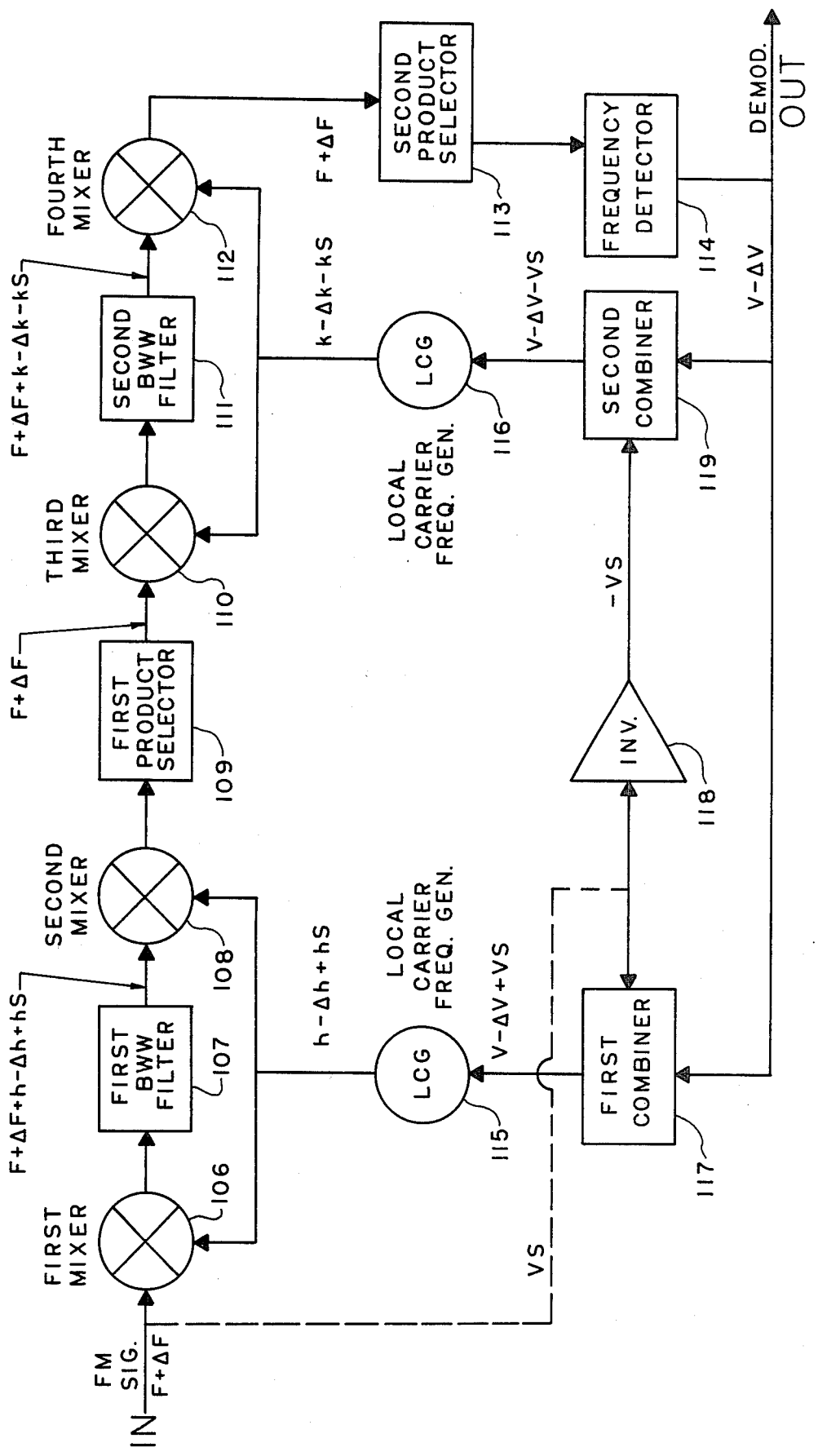
FIG. 3 is a block diagram of a third embodiment of the demodulator in accordance with the present invention.

Referring now to FIG. 3, a further alternate preferred embodiment of the demodulator according to the present invention includes a first mixer means 106, having a signal input coupled to be responsive to the FM signal, an LCF input coupled to an output of a LCG means 115, and an output coupled to an input of a first bandwidth-window filter means 107. Bandwidth-window filter means 107 includes an output coupled to a signal input of a second mixer means 108, which also has an LCF input coupled to the output of the aforesaid LCG means 115, and an output coupled to an input of product selector means 109, which has an output coupled to a signal input of a third mixer means 110. Third mixer means 110 includes a LCF input coupled to an output of a LCG means 116, and an output coupled to an input of a second bandwidth-window fitler means 111. Bandwidth-window filter means 111 includes an output coupled to a signal input of a fourth mixer means 112, which also has a LCF input coupled to an output of the aforesaid LCG means 116, and an output coupled to an input of product selector means 113, which has an output coupled to an input of frequency detector means 114, from an output of which a demodulated output signal is coupled. LCG means 115 also includes a frequency-controlling input coupled to said output of said frequency detector means 114, via a first combiner means 117, which, in addition to receiving an input coupled from said output of said frequency detector means 114, further receives an input, coupled also to an input of an inverter means 118, indicative of the strength of said FM signal, and provides an output representative of both said strength of said FM signal and said output of said frequency detector means 114; said output being coupled to said frequency-controlling input of said LCG means 115. LCG means 116 also includes a frequency-controlling input coupled to said output of said frequency detector means 114, via a second combiner means 119, which, in addition to receiving an input coupled from said output of said frequency detector means 114, further receives an input coupled from an output of said inverter means 118, and provides an output representative of both inputs; said output being coupled to said frequency-controlling input of said LCG means 116. The aforementioned first and second bandwidth-window filter means 107 and 111, respectively, typically are fixed-tuned in regard to overall bandwidth and frequency-response characteristics, as well as in regard to center frequency. It will be shown hereinafter that overall system bandwidth is variable, although filter means 107 and 111 are fixed-tuned.

Now, the embodiment of the present invention is described in more detail.

In operation, said LCG means 115, which is an LCG means analogous to the aforementioned LCG means 98 and 105, of FIG. 1 and FIG. 2, respectively, has a center frequency h, which may be shifted by an amount $(-\Delta h)$ by a feedback component $(-\Delta V)$ of the feedback signal $V - \Delta V$ derived from said output of said frequency detector means 114; and by a further amount, hS, by a signal, VS, derived from means (not shown) for providing a signal indicative of the strength of said FM signal; the parameters $(-\Delta V)$ and VS being summed at the output of said first combiner means 117. The frequency $h - \Delta h + hS$ mixes in said first mixer means 106 with the frequency $F + \Delta F$ of the FM signal to provide a sum frequency $F + \Delta F + h - \Delta h + hS$, which is passed by said first bandwidth-window filter means 107 when said sum frequency is within the bandpass window of said filter means 107, having center frequency substantially equal to $F + h$. Said sum frequency mixes with said frequency $h - \Delta h + hS$ in said second mixer means 108 to provide a difference frequency $F + \Delta F$, which is passed by said product selector means 109, which, analogously to product selector means 94 and 103, of FIG. 1 and FIG. 2, respectively, is a filter means designated herein as a said product selector means, to said signal input of said third mixer means 110. Said LCG means 116, which is analogous to said LCG means 115, has a center frequency k, which may be shifted by an amount $(-\Delta k)$ by said feedback signal component $(-\Delta V)$ of said feedback signal $V - \Delta V$; and by a further amount $(-kS)$ by a signal $(-VS)$ derived from said output of said inverter means 118 which is responsive to said signal VS; the parameters $(-\Delta V)$ and $(-VS)$ being summed at the output of said second combiner means 119. The frequency $k - \Delta k - kS$ mixes in said third mixer means 110 with the frequency $F + \Delta F$ of the FM signal to provide a sum frequency $F + \Delta F + k - \Delta k - kS$, which is passed by said second bandwidth-window filter means 111 when said sum frequency is within the bandpass window of said filter means 111, having center frequency substantially equal to $F + k$. Said sum frequency mixes with said frequency $k - \Delta k - kS$ in said fourth mixer means 112 to provide a difference frequency $F + \Delta F$, which is passed by said product selector means 113, which, analogously to said product selector means 109, is a filter means referred to herein as a said product selector means, to said signal input of said frequency detector means 114. Analogously to the embodiments of FIG. 1 and FIG. 2, the input signal frequency is converted to the frequency $F + \Delta F$ regardless of the feedback signal component $(-\Delta V)$, so that there is no net shift of frequency of any frequency component of said FM signal resulting from the feedback derived from said output of said frequency detector means 114. The center frequencies of the filter means 107 and 111 are, of course, substantially fixed.

It will be appreciated that, analogously to the embodiments of FIG. 1 and FIG. 2, as the instantaneos value of the carrier frequency $F + \Delta F$ of the said FM signal varies, $\Delta h$ and $\Delta k$ can be arranged to vary so that the frequencies $F + \Delta F + h - \Delta h + hS$ and $F + \Delta F + k - \Delta k - kS$, or $(\Delta F - \Delta h) + F + h + hS$ and $(\Delta F - \Delta k) + F + k - kS$, respectively, remain constant or substantially constant, thus remaining within the bandpass windows of said fixed-center-frequency filter means 107 and 111, respectively, when hS and kS are sufficiently small, by appropriate offsetting, scaling and selection of polarity of the output signal of said frequency detector means 114, fed back via said combiner means 117 and 119, respectively, to derive the feedback signal component ($-\Delta V$) in such a way that the frequency shifts ($-\Delta h$) and ($-\Delta k$) substantially counter the frequency shift $\Delta F$.

It will also be appreciated, however, that for the mixer products ($\Delta F - \Delta h$)+F+h+hS and ($\Delta F - \Delta k$)+F+k−kS to remain centered, or at least within, the bandpass windows of said bandwidth-window filter means 107 and 111, respectively, having, as previously mentioned, center frequency substantially equal to F+h and F+k, respectively, in the illustrative embodiment of FIG. 3, said feedback must maintain the terms ($\Delta F - \Delta h$) and ($\Delta F - \Delta k$) at sufficiently low values; otherwise the frequency F+$\Delta F$ would be converted by mixer means 106 and 110 to different points on the frequency-response curves of said filter means 107 and 111, respectively, or to points in the reject bands of said filter means 107 and 111. This indicates that the center frequency of the overall filtering response of the system, from said input of said first mixer means 106 to the input of said frequency detector means 114, substantially tracks the instantaneous carrier frequency of said FM signal, in response to said feedback.

It will be further appreciated, however, that since, when tracking is effected, the sum frequencies ($\Delta F - \Delta h$)+F+h+hS and ($\Delta F - \Delta k$)+F+k−kS, at the outputs of said first and third mixer means 106 and 110, respectively, become F+h+hS and F+k−kS, respectively, so that the instantaneous FM carrier frequency of said FM signal converts to a frequency differing by +hS from the center frequency of said first bandwidth-window filter means 107, and to a frequency differing by ($-kS$) from the center frequency of said second bandwidth-window filter means 111. This indicates that the contribution to the overall filtering response of the system due to said first filter means 107, shifts in center frequency by +hS due to signal-strength-related parameter VS, and that the contribution to the overall filtering response of the system, due to said second filter means 111, shifts in center frequency by ($-kS$). Thus, if, for example, said bandwidth-window filter means 107 and 111 exhibit essentially identical and symmetrical frequency response curves, and if hS is substantially equal to kS, the overall filtering response of the system, taking into account the contributions due to both filter means 107 and 111, will have maximum bandwidth when hS or kS is essentially zero, and the bandwidth of said overall filtering response will decrease as hS or kS increase; while the center frequency of said overall filtering response will remain substantially constant as said bandwidth increases or decreases.

Thus, the overall filtering response of the system, from the signal input of said first mixer means 106 to the input of said frequency detector means 114, substantially tracks the instantaneous carrier frequency of the FM signal, while the bandwidth window of said overall filtering response may be maintained constant, or may be rendered responsive to signal strength, by appropriate offsetting, scaling and selection of polarity of the parameter VS indicative of signal strength; while requiring only fixed-tuned filter means of fixed bandpass characteristics. Said bandwidth/bandwidth window may be made narrower than the bandwidth of said FM signal. Thus inherent noise may be deleted relative to the carrier of said FM signal, thereby effecting extension of noise C/N threshold relative to the demodulation of said FM signal. The center frequencies of said LCG means 115 and 116 may be different; however, if they are substantially equal, and if said means 115 and 116 are at least fairly well matched, the equalizing of the frequency shifts hS and kS, for a shift of parameter VS at the input of said inverter means 118, will be facilitated.

Referring again to FIG. 1, it may be noted that, in accordance with the general conception of the demodulator according to the present invention, the combination of LCG means 98, LCG means 99, third mixer means 97 and difference-frequency-responsive filter means 96 constitutes yet another LCG means as defined heretofore herein.

It may be further noted at this point that LCG means 105 of FIG. 2 could be replaced by, for example, two different LCG means, one having an output connected to the LCF input of mixer means 100 and the other having an output connected to the LCF input of mixer means 102, with the frequency-controlling inputs of both LCG means being coupled to the feedback signal V−$\Delta V$. It will be appreciated that the center frequencies of said two LCG means could be different, without basically affecting the operation of the system of FIG. 2, if the frequency shifts due to ($-\Delta V$) of the output frequencies of said LCG means were equal. A difference in center frequencies would require a retuning of product selector means 103 and possibly of frequency detector means 104. Analogously, LCG means 115, of FIG. 3, and/or LCG means 116, of FIG. 3, could also each be replaced by, for example, two different LCG means, without any basic effect on the operation of the system illustrated in said FIG. 3.

In all of the foregoing illustrative embodiments of the FM demodulator system according to the present invention, it has been shown that the frequency shifts of the filtered mixer products of the cascade of demodulator elements, whether filtered by bandwidth-window filter means or product selector filter means, combine to provide a net sum of zero as reflected in the signal that is received at the input of the FM detector means; so that all frequency shifts of the frequency-converted FM signal carrier, produced at the outputs of the mixer means comprised in said cascade, effectively cancel as seen at said input of said FM detector means.

Additionally, in all of the foregoing illustrative embodiments of the demodulator system according to the present invention, it has been shown that each filter means designated as a bandwidth-window filter means operates to control the overall tracking bandwidth of the demodulator and hence to effectively filter the instantaneous carrier frequency of the FM signal, as said demodulator effectively tracks said instantaneous carrier frequency, while the center frequency of said bandwidth-window filter means remains substantially unchanged. It has also been shown that variation of the tracking bandwidth of the demodulator may be effected by varying the bandwidth of a said bandwidth-window filter means, as in the embodiments of FIG. 1 or FIG. 2. It has also been shown that, in some alternate preferred embodiments, the tracking bandwidth may be varied without change of filter parameters, as in the embodiment of FIG. 3. It has been further shown that the input FM signal is either transferred to the input of the frequency detector means of the FM demodulator system unchanged, or with a constant frequency offset, so that no frequency modulation of the carrier frequency of the FM signal occurs, due to the system feedback, at said input of said frequency detector means. Thus the FM carrier is tracked, but essentially unaltered relative to translation to said input of said frequency detector means, by said feedback, eliminating waveform fidelity difficulties inherent in prior-art carrier-tracking systems such as the heretofore-mentioned FMFB. Advantageous improvement of demodulation of signals of critical modulation waveform, such as signals comprising digital pulses, is thus facilitated by the FM demodulator system according to the present invention.

It may be yet further noted that although the foregoing illustrative embodiments have been analyzed relative to low modulation frequencies without reference to a filter network in the feedback loop, a loop filter of course may be of any type known in the art. As well as being implemented as a conventional low-pass type of loop filter network, said network may also be, for example, implemented as a network providing a zero or low phase delay at the low video frequencies, a region of increased loop attenuation in a band of intermediate video frequencies, and a phase delay of about 360 degrees at a frequency higher than the aforesaid band, as is known in the prior art. Said frequency of 360 degrees phase delay may advantageously be arranged to fall within the frequency spectrum of a pulse component of modulation, as, for example, in the case of a digital FM signal, thereby tending to sustain low-frequency threshold extension at the upper video frequencies, e.g., the spectrum of a pulse component of modulation.

Further aspects are that the polarity of the frequency swing of the translated signal at the input of said frequency detector means need not be of the same polarity as the frequency swing of said FM signal; in alternate embodiments it may of course be reversed if desired. The FM carrier still remains tracked but essentially unaltered by said feedback in such a case, in the sense defined heretofore herein. An example of such a case is where the frequency L is larger than the frequency F in the system illustrated in the afore-described FIG. 1; in this case the signs of the terms of the input frequency to second mixer means 93 may be reversed and said product selector means 94 may pass the sum, rather than the difference, of the two input frequencies of said mixer means; producing a frequency-detector-means input frequency of $L-F-\Delta F$, in which polarity reversal is exhibited, as described above.

In regard to product selector filter elements as referred to herein, it may further be noted that such an element or elements, when configured as in FIGS. 1, 2 or 3, can suppress cross-modulation effects, generally deleterious to FM threshold, in a subsequent mixer element or in an FM detector element, where such mixer, FM detector element, or other element, e.g., amplifier stage, contains an active device which can generate cross-modulation products, due to inadvertent non-linearity, when in-band and out-of-band signals are applied to such active device simultaneously. In the said Figures, such elements have been configured between two other elements, as, e.g., directly between a mixer and a mixer or between a mixer and an FM detector. To a lesser extent, a product selector element as constituted by, e.g., a sub-element such as a tank circuit in a limiter stage, mixer stage, discriminator stage, etc., can also suppress deleterious cross-modulation. However, in such a case, cross-modulation will be suppressed only from those active elements, e.g., discriminator diodes, which follow such a product selector element, rather than from active devices which may preceed such a product selector element, e.g., an amplifier element, which may be part of an overall discriminator circuit, driving a tank circuit or tank circuits acting primarily to provide S-curve response for FM detection and secondarily to reject out-of-band components. Thus such an intrinsic product selector element, in some applications, can require supplementing by a separate filter element utilized as a product selector, as in FIGS. 1, 2 or 3, for optimal extension of FM threshold.

From the foregoing embodiments of the invention, it will now be apparent that a new and improved FM signal demodulation system has been discovered. It will be apparent to those skilled in the art that various changes and modifications may be substituted for elements of the present invention without departing from the true scope of the invention. In addition, many modifications may be made to adapt a particular situation or material to the teachings of the invention without departing from the central scope thereof. Therefore, it is intended that this invention not be limited to the particular embodiments disclosed as the best mode contemplated for carrying out the invention, but that the invention will include all embodiments falling within the scope of the appended claims.

I claim:

1. An FM demodulator system comprising, in combination: a plurality of mixer means; at least one LCG (local-carrier-frequeny-generator) means; each said mixer means including a signal input, a LCF (local-carrier-frequency) input for receiving a LCF signal from a said LCG means, and an output; said plurality of mixer means being included in a cascade of comprised elements of said FM demodulator system; the signal input of a first of said plurality of mixer means being coupled to be responsive to an FM signal, a signal input of each remaining said mixer means being coupled to be responsive to an output of a preceeding one of said mixer means; further comprising, in said cascade, a frequency detector means, having an input coupled to be responsive to an output of a last of said plurality of mixer means, and an output, from which a demodulated signal is coupled; further comprising at least one bandwidth-window filter means, having a filtering response characterized by a substantially predetermined center frequency; said bandwidth-window filter means being included at a point intermediate said cascade, and having at least a signal input coupled to be responsive to an output of a selected one of said mixer means, and an output coupled to a signal input of a subsequent one of said mixer means; further comprising at least one product selector filter means, comprised in said cascade; each said product selector means having an input coupled to be responsive to an output of a said mixer means, and an output coupled to an input of a subsequent comprised element of said cascade; each said product selector means passing a selected mixer product, said product being generated in a mixer means preceeding said product selector means, from an input signal of said preceeding mixer means; at least one of said LCG means having a frequency-controlling input for controlling the frequency of said LCG means; further comprising a control loop for applying a feedback signal between an output of said frequency detector means and a said frequency-controlling input of a said LCG means; wherein, in consequence of said feedback signal, frequency shifts are produced in the LCG signals received by at least two of said LCF inputs; wherein the resultant of the frequency shifts of the filtered mixer output signals of said cascade of said elements, in the output signal received at said input of said frequency detector means, consequent to said frequency shifts produced in said LCF signals by said feedback signal, is a net frequency shift of substantially zero; so that the net shift of frequency, consequent to said feedback signal, of each converted frequency component of said FM signal, at said input of said frequency detector means, is substantially zero; wherein said intermediate point at which said bandwidth-window filter means is included is selected whereby in consequence of said feedback signal, there results a shift of overall filtering response, between said signal input of said first mixer means and said input of said frequency detector means; and wherein said control loop is arranged to cause the shifting bandwidth window of said overall filtering response to substantially track the instantaneous carrier frequency of said FM signal; wherein said plurality of mixer means comprises two mixer means; a signal input of a first said mixer means being coupled to be responsive to said FM signal, and an output of said first mixer means being coupled to a signal input of a said bandwidth-window filter means, an output of which is coupled to a signal input of a second said mixer means, an output of which is coupled to an input of a said product selector means, an output of which is coupled to an input of said frequency detector means; wherein said feedback signal is applied to a said frequency-controlling input of a first said LCG means coupled to a said LCF input of said second mixer means; further comprising a third mixer means for providing a difference-frequency output, in response to the difference frequency between the instantaneous output frequency of said first LCG means and the frequency output of a second said LCG means for effecting tuning of said FM signal; the output of said third mixer means being filtered by difference-frequency responsive filter means responsive to said difference frequency; the output of said difference-frequency-responsive means being coupled to a LCF input of said first mixer means; wherein the center frequency of said first LCG means is less than the frequency of said second LCG means, the frequency of which is less than the center frequency of said FM signal; and wherein the filtering response of said bandwidth-window filter means passes at least the difference frequency between the center carrier frequency of said FM signal and the center output frequency of said difference-frequency-responsive means; said product selector means passing a band of difference frequencies, each frequency of said band being a difference frequency between the instantaneous output frequency of said bandwidth-window filter means and the instantaneous output frequency of said first LCG means.

2. An FM demodulator system according to claim 1, wherein said bandwidth-window filter means is an adaptive filter means, further comprising a bandwidth-varying input for varying the bandwidth of said bandwidth-window filter means in response to the strength of said FM signal, thereby rendering the bandwidth of said bandwidth window of said overall filtering response responsive to said strength of said FM signal.

3. An FM demodulator system according to claim 1, wherein said product selector means has the bandwidth of said FM signal.

4. An FM demodulator system according to claim 1, further comprising means for maintaining the center frequency of said difference-frequency-responsive means substantially matched to the center frequency of the band of difference frequencies comprised in the output signal of said third mixer means.

5. An FM demodulator system comprising, in combination: a plurality of mixer means; at least one LCG (local-carrier-frequency-generator) means; each said mixer means including a signal input, a LCF (local-carrier-frequency) input for receiving a LCF signal from a said LCG means, and an output; said plurality of mixer means being included in a cascade of comprised elements of said FM demodulator system; the signal input of a first of said plurality of mixer means being coupled to be responsive to an FM signal, a signal input of each remaining said mixer means being coupled to be responsive to an output of a preceeding one of said mixer means; further comprising, in said cascade, a frequency detector means, having an input coupled to be responsive to an output of a last of said plurality of mixer means, and an output, from which a demodulated signal is coupled; further comprising at least one bandwidth-window filter means, having a filtering response characterized by a substantially predetermined center frequency; said bandwidth-window filter means being included at a point intermediate said cascade, and having at least a signal input coupled to be responsive to an output of a selected one of said mixer means, and an output coupled to a signal input of a subsequent one of said mixer means; further comprising at least one product selector filter means, comprised in said cascade; each said product selector means having an input coupled to be responsive to an output of a said mixer means, and an output coupled to an input of a subsequent comprised element of said cascade; each said product selector means passing a selected mixer product, said product being generated in a mixer means preceeding said product selector means, from an input signal of said preceeding mixer means; at least one of said LCG means having a frequency-controlling input for controlling the frequency of said LCG means; further comprising a control loop for applying a feedback signal between an output of said frequency detector means and a said frequency-controlling input of a said LCG means; wherein, in consequence of said feedback signal, frequency shifts are produced in the LCF signals received by at least two of said LCF inputs; wherein the resultant of the frequency shifts of the filtered mixer output signals of said cascade of said elements, in the output signal received at said input of said frequency detector means, consequent to said frequency shifts produced in said LCF signals by said feedback signal, is a net frequency shift of substantially zero; so that the net shift of frequency, consequent to said feedback signal, of each converted frequency component of said FM signal, at said input of said frequency detector means, is substantially zero; wherein said intermediate point at which said bandwidth-window filter means is included is selected whereby in consequence of said feedback signal, there results a shift of overall filtering response, between said signal input of said first mixer means and said input of said frequency detector means; and wherein said control loop is arranged to cause the shifting bandwidth-window of said overall filtering response to substantially track the instantaneous carrier frequency of said FM signal; wherein said plurality of mixer means comprises two mixer means; a signal input of a first said mixer means being coupled to be responsive to said FM signal, and an output of said first mixer means being coupled to a signal input of a said bandwidth-window filter means, an output of which is coupled to a signal input of a second said mixer means, a output of which is coupled to an input of a said product selector means, an output of which is coupled to an input of said frequency detector means; wherein said feedback signal is applied to a frequency-controlling input of a said LCG means, for providing a LCF input to said first and second mixer means; an output of said LCG means being coupled to both a LCF input of said first mixer means, and to a LCF input of said second mixer means; wherein the filtering response of said bandwidth-window filter means passes at least the sum frequency of the center output frequency of said LCG means and the center carrier frequency of said FM signal; wherein said product selector means passes a band of difference frequencies, each frequency of said band being a difference frequency between the instantaneous output frequency of said bandwidth-window filter means and the instantaneous output frequency of said LCG means; wherein said bandwidth-window filter means is an adaptive filter means, further comprising a bandwidth-varying input for varying the bandwidth of said bandwidth-window filter means in response to the strength of said FM signal, thereby rendering the bandwidth of said bandwidth window of said overall filtering response responsive to said strength of said FM signal.

6. An FM demodulator system comprising, in combination: a plurality of mixer means; at least one LCG (local-carrier-frequency-generator) means; each said mixer means including a signal input, a LCF (local-carrier-frequency) input for receiving a LCF signal from a said LCG means, and an output; said plurality of mixer means being included in a cascade of comprised elements of said FM demodulator system; the signal input of a first of said plurality of mixer means being coupled to be responsive to an FM signal, a signal input of each remaining said mixer means being coupled to be responsive to an output of a preceeding one of said mixer means; further comprising, in said cascade, a frequency detector means, having an input coupled to be responsive to an output of a last of said plurality of mixer means, and an output, from which a demodulated signal is coupled; further comprising at least one bandwidth-window filter means, having a filtering response characterized by a substantially predetermined center frequency; said bandwidth-window filter means being included at a point intermediate said cascade, and having at least a signal input coupled to be responsive to an output of a selected one of said mixer means, and an output coupled to a signal input of a subsequent one of said mixer means; further comprising at least one product selector filter means, comprised in said cascade; each said product selector means having an input coupled to be responsive to an output of a said mixer means, and an output coupled to an input of a subsequent comprised element of said cascade; each said product selector means passing a selected mixer product, said product being generated in a mixer means preceeding said product selector means, from an input signal of said preceeding mixer means; at least one of said LCG means having a frequency-controlling input for controlling the frequency of said LCG means; further comprising a control loop for applying a feedback signal between an output of said frequency detector means and a said frequency-controlling input of a said LCG means; wherein, in consequence of said feedback signal, frequency shifts are produced in the LCF signals received by at least two of said LCF inputs; wherein the resultant of the frequency shifts of the filtered mixer output signals of said cascade of said elements, in the output signal received at the input of said frequency detector means, consequent to said frequency shifts produced in said LCF signals by said feedback signal, is a net frequency shift of substantially zero; so that the net shift of frequency, consequent to said feedback signal, of each converted frequency component of said FM signal, at said input of said frequency detector means, is substantially zero; wherein said intermediate point at which said bandwidth-window filter means is included is selected whereby in consequence of said feedback signal, there results a shift of overall filtering response, between said signal input of said first mixer means and said input of said frequency detector means; and wherein said control loop is arranged to cause the shifting bandwidth window of said overall filtering response to substantially track the instantaneous carrier frequency of said FM signal; wherein said plurality of mixer means comprises four mixer means; a signal input of a first said mixer means being coupled to be responsive to said FM signal, and an output of said first mixer means being coupled to a signal input of a first said bandwidth-window filter means; an output of which is coupled to a signal input of a second said mixer means; an output of which is coupled to an input of a first said product selector means; an output of which is coupled to a signal input of a third said mixer means; an output of which is coupled to a signal input of a second said bandwidth-window filter means; an output of which is coupled to a signal input of a fourth said mixer means; an output of which is coupled to an input of a second said product selector means; an output of which is coupled to an input of said frequency detector means; wherein said feedback signal is applied via a first combiner means to a frequency-controlling input of a first said LCG means for providing a LCF signal to said first and second mixer means; and wherein said feedback signal is applied via a second combiner means to a frequency-controlling input of a second said LCG means for providing a LCF signal to said third and fourth mixer means; said first combiner means being adapted to provide an output signal in combined response to said feedback signal and to a signal representative of the strength of said FM signal; and said second combiner means being adapted to provide an output signal in combined response to said feedback signal and to the polarity-inverse of said signal representative of said strength of said FM signal; said output signal of said first combiner means being applied to said frequency-controlling input of said first LCG means, and output of which is coupled to both a LCF input of said first mixer means and a LCF input of said second mixer means; said output signal of said second combiner means being applied to said frequency-controlling input of said second LCG means, an output of which is coupled to both a LCF input of said third mixer means and to a LCF input of said fourth mixer means; wherein the filtering response of said first bandwidth-window filter means passes at least the sum frequency of the center output frequency of said first LCG means and the center carrier frequency of said FM signal; said first product selector means passing a band of difference frequencies, each frequency of said band being a difference frequency between the instantaneous output frequency of said first bandwidth-window filter means and the instantaneous output frequency of said first LCG means; wherein the filtering response of said second bandwidth-window filter means passes at least the sum frequency of the center output frequency of said second LCG means and said center carrier frequency of said FM signal; said second product selector means passing a band of difference frequencies, each frequency of said band being a difference frequency between the instantaneous output frequency of said second bandwidth-window filter means and the instantaneous output frequency of said second LCG means; whereby the bandwidth of said overall filtering response is rendered responsive to said signal representative of said strength of said FM signal, and hence to said strength of said FM signal.

7. An FM demodulator system according to claim 6, wherein the center frequencies of said first and second LCG means are substantially equal.

8. An FM demodulator system, in combination: a plurality of mixer means; at least one LCG (local-carrier-frequency-generator) means; each said mixer means including a signal input, a LCF (local-carrier-frequency) input for receiving a LCF signal from a said LCG means, and an output; said plurality of mixer means being included in a cascade of comprised elements of said FM demodulator system; the signal input of a first of said plurality of mixer means being coupled to be responsive to an FM signal, a signal input of each remaining said mixer means being coupled to be responsive to an output of a preceeding one of said mixer means; further comprising, in said cascade, a frequency detector means, having an input coupled to be responsive to an output of a last of said plurality of mixer means, and an output, from which a demodulated signal is coupled; further comprising at least one bandwidth-window filter means, having a filtering response characterized by a substantially predetermined center frequency; said bandwidth-window filter means being included at a point intermediate said cascade, and having at least a signal input coupled to be responsive to an output of a selected one of said mixer means, and an output coupled to a signal input of a subsequent one of said mixer means; further comprising at least one product selector filter means, comprised in said cascade; each said product selector means being different from each said bandwidth-window filter means; each said product selector means having an input coupled to be responsive to an output of a said mixer means, and an output coupled to an input of a subsequent comprised element of said cascade; each said product selector means passing a selected mixer product, said product being genrated in a mixer means preceeding said product selector means, from an input signal of said peeceeding mixer means; each said product selector means rejecting mixer products deleterious to FM threshold; at least one of said LCG means having a frequency-controlling input for controlling the frequency of said LCG means; further comprising a control loop for applying a feedback signal between an output of said frequency detector means and a said frequency-controlling input of a said LCG means; wherein, in consequence of said feedback signal, frequency shifts are produced in the LCF signals received by at least two of said LCF inputs; wherein the resultant of the frequency shifts of the filtered mixer output signals of said cascade of said elements, in the output signal received at said input of said frequency detector means, consequent to said frequency shifts produced in said LCF signals by said feedback signal, is a net frequency shift of substantially zero; so that the net shift of frequency, consequent to said feedback signal, of each converted component of said FM signal, at said input of said frequency detector means, is substantially zero; wherein said intermediate point at which said bandwidth-window filter means is included is selected whereby in consequence of said feedback signal, there results a shift of overall filtering response, between said signal input of said first mixer means and said input of said frequency detector means; and wherein said control loop is arranged to cause the shifting bandwidth of said overall filtering response to substantially track the instantaneous carrier frequency of said FM signal, wherein said bandwidth-window filter means is an adaptive filter means, further comprising a bandwidth-varying input for varying the bandwidth of said bandwidth-window filter means in response to at least one chosen parameter of said FM signal, thereby rendering the bandwidth of said bandwidth window of said overall filtering response responsive to said parameter of said FM signal.

9. An FM demodulator system comprising, in combination: a plurality of mixer means; at least one LCG (local-carrier-frequency-generator) means; each said mixer means including a signal input, a LCF (local-carrier-frequency) input for receiving a LCF signal from a said LCG means, and an output; said plurality of mixer means being included in a cascade of comprised elements of said FM demodulator system; the signal input of a first of said plurality of mixer means being coupled to be responsive to an FM signal, a signal input of each remaining said mixer means being coupled to be responsive to an output of a preceeding one of said mixer means; further comprising, in said cascade, a frequency detector means, having an input coupled to be responsive to an output of a last of said plurality of mixer means, and an output, from which a demodulated signal is coupled; further comprising at least one bandwidth-window filter means, having a filtering response characterized by a substantially predetermined center frequency; said bandwidth-window filter means being included at a point intermediate said cascade, and having at least a signal input coupled to be responsive to an output of a selected one of said mixer means, and an output coupled to a signal input of a subsequent one of said mixer means; further comprising at least one product selector filter means, comprised in said cascade; each said product selector means being different from each said bandwidth-window filter means; each said product selector means having an input coupled to be responsive to an output of a said mixer means, and an output coupled to an input of a subsequent comprised element of said cascade; each said product selector means passing a selected mixer product, said product being generated in a mixer means preceeding said product selector means, from an input signal of said preceeding mixer means; each said product selector means rejecting mixer products deleterious to FM threshold; at least one of said LCG means having a frequency-controlling input for controlling the frequency of said LCG means; further comprising a control loop for applying a feedback signal between an output of said frequency detector means and a said frequency-controlling input of a said LCG means; wherein, in consequence of said feedback signal, frequency shifts are produced in the LCF signals received by at least two of said LCF inputs; wherein the resultant of the frequency shifts of the filtered mixer output signals of said cascade of said elements, in the output signal received at said input of said frequency detector means, consequent to said frequency shifts produced in said LCF signals by said feedback signal, is a net frequency shift of substantially zero; so that the net shift of frequency, consequent to said feedback signal, of each converted component of said FM signal, at said input of said frequency detector means, is substantially zero; wherein said intermediate point at which said bandwidth-window filter means is included is selected whereby in consequence of said feedback signal, there results a shift of overall filtering response, between said signal input of said first mixer means and said input of said frequency detector means; and wherein said control loop is arranged to cause the shifting bandwidth window of said overall filtering response to substantially track the instantaneous carrier frequency of said FM signal wherein said plurality of mixer means comprises two mixer means; a signal input of a first said mixer means being coupled to be responsive to said FM signal, and an output of said first mixer means being coupled to a signal input of a said bandwidth-window filter means, an output of which is coupled to a signal input of a second said mixer means, an output of which is coupled to an input of said frequency detector means; wherein said feedback signal is applied to a said frequency-controlling input of a first said LCG means coupled to a said LCF input of said second mixer means; further comprising a third mixer means for providing an output frequency, in response to the instantaneous output frequency of said first LCG means and the frequency output of a second said LCG means for effecting tuning of said FM signal; the output of said third mixer means being filtered by third-mixer-output-frequency-responsive filter means responsive to said output frequency; the output of said third-mixer-output-frequency-responsive means being coupled to a LCF input of said first mixer means.

10. An FM demodulator system according to claim 9, wherein an output of said second mixer means is coupled to an input of said frequency detector means; an output of which is coupled to an input of said frequency detector means; said product selector means passing a band of second-mixer-output frequencies and excluding spurious output products, deleterious to FM threshold, of said second mixer means.

11. An FM demodulator system comprising, in combination: a plurality of mixer means; at least one LCG (local-carrier-frequency-generator) means; each said mixer means including a signal input, a LCF (local-carrier-frequency) input for receiving a LCF signal from a said LCG means, and an output; said plurality of mixer means being included in a cascade of comprised elements of said FM demodulator system; the signal input of a first of said plurality of mixer means being coupled to be responsive to an FM signal, a signal input of each remaining said mixer means being coupled to be responsive to an output of a preceeding one of said mixer means; further comprising, in said cascade, a frequency detector means, having an input coupled to be responsive to an output of a last of said plurality of mixer means, and an output, from which a demodulated signal is coupled; further comprising at least one bandwidth-window filter means, having a filtering response characterized by a substantially predetermined center frequency; said bandwidth-window filter means being included at a point intermediate said cascade, and having at least a signal input coupled to be responsive to an output of a selected one of said mixer means, and an output coupled to a signal input of a subsequent one of said mixer means; further comprising at least one product selector filter means, comprised in said cascade; each said product selector means being different from each said bandwidth-window filter means; each said product selector means having an input coupled to be responsive to an output of a said mixer means, and an output coupled to an input of a subsequent comprised element of said cascade; each said product selector means passing a selected mixer product, said product being generated in a mixer means preceeding said product selector means, from an input signal of said preceeding mixer means; each said product selector means rejecting mixer products deleterious to FM threshold; at least one of said LCG means having a frequency-controlling input for controlling the frequency of said LCG means; further comprising a control loop for applying a feedback signal between an output of said frequency detector means and a said frequency-controlling input of a said LCG means; wherein, in consequence of said feedback signal, frequency shifts are produced in the LCF signals received by at least two of said LCF inputs; wherein the resultant of the frequency shifts of the filtered mixer output signals of said cascade of said elements, in the output signal received at said input of said frequency detector means, consequent to said frequency shifts produced in said LCF signals by said feedback signal, is a net frequency shift of substantially zero; so that the net shift of frequency, consequent to said feedback signal, of each converted component of said FM signal, at said input of said frequency detector means, is substantially zero; wherein said intermediate point at which said bandwidth-window filter means is included is selected whereby in consequence of said feedback signal, there results a shift of overall filtering response, between said signal input of said first mixer means and said input of said frequency detector means; and wherein said control loop is arranged to cause the shifting bandwidth window of said overall filtering response to substantially track the instantaneous carrier frequency of said FM signal, wherein said plurality of mixer means comprises four mixer means; a signal input of a first said mixer means being coupled to be responsive to said FM signal, and an output of said first mixer means being coupled to a signal input of a first said bandwidth-window filter means; an output of which is coupled to a signal input of a second said mixer means; an output of which is coupled to a signal input of a third said mixer means; an output of which is coupled to a signal input of a second said bandwidth-window filter means; an output of which is coupled to a signal input of a fourth said mixer means; an output of which is coupled to an input of said frequency detector means; wherein said feedback signal is applied via a first combiner means to a frequency-controlling input of a first said LCG means for providing a LCF signal to said first and second mixer means; and wherein said feedback signal is applied via a second combiner means to a frequency-controlling input of a second said LCG means for providing a LCF signal to said third and fourth mixer means; said first combiner means being adapted to provide an output signal in combined response to said feedback signal and to a signal representative of at least one chosen parameter of said FM signal; and said second combiner means being adapted to provide an output signal in combined response to said feedback signal and to the polarity-inverse of said signal representative of said parameter of said FM signal; said output signal of said first combiner means being applied to said frequency-controlling input of said first LCG means, an output of which is coupled to both a LCF input of said first mixer means and a LCF input of said second mixer means; said output signal of said second combiner means being applied to said frequency-controlling input of said second LCG means, an output of which is coupled to both a LCF input of said third mixer means and to a LCF input of said fourth mixer means; whereby the bandwidth of said overall filtering response is rendered responsive to said signal representative of said parameter of one FM signal, and hence to said parameter of said FM signal.

12. An FM demodulator system according to claim 11, wherein an output of said second mixer means is coupled to an input of a first said product selector means; an output of which is coupled to a signal input of said third mixer means; an output of said fourth mixer means being coupled to an input of a second said product selector means; an output of which is coupled to a signal input of said frequency detector means; said first product selector means passing a band of second-mixer output frequencies and excluding spurious products, deleterious to FM threshold, of said second mixer means; said second product selector means passing a band of fourth-mixer output frequencies and excluding spurious output products, deleterious to FM threshold, of said fourth mixer means.

13. An FM modulator system comprising, in combination: a plurality of mixer means; at least one LCG (local-carrier-frequency-generator) means; each said mixer means including a signal input, a LCF (local-carrier-frequency) input for receiving a LCF signal from a said LCG means, and an output; said plurality of mixer means being included in a cascade of comprised elements of said FM demodulator system; the signal input of a first of said plurality of mixer means being coupled to be responsive to an FM signal, a signal input of each remaining said mixer means being coupled to be responsive to an output of a preceeding one of said mixer means; further comprising, in said cascade, a frequency detector means, having an input coupled to be responsive to an output of a last of said plurality of mixer means, and an output, from which a demodulated signal is coupled; further comprising at least one bandwidth-window filter means, having a filtering response characterized by a substantially predetermined center frequency; said bandwisth-window filter means being included at a point intermediate said cascade, and having at least a signal input coupled to be responsive to an output of a selected one of said mixer means, and an output coupled to a signal input of a subsequent one of said mixer means; further comprising at least one product selector filter means, comprised in said cascade; each said product selector means being different from each said bandwidth-window filter means; each said product selector means having an input coupled to be responsive to an output of a said mixer means, and an output coupled to an input of a subsequent comprised element of said cascade; each said product selector means passing a selected mixer product, said product being generated in a mixer means preceeding said product selector means, from an input signal of said preceeding mixer means; each said product selector means rejecting mixer products deleterious to FM threshold; at least one of said LCG means having a frequency-controlling input for controlling the frequency of said LCG means; further comprising a control loop for applying a feedback signal between an output of said frequency detector means and a said frequency-controlling input of a said LCG means; wherein, in consequence of said feedback signal, frequency shifts are produced in the LCF signals received by at least two of said LCF inputs; wherein the resultant of the frequency shifts of the filtered mixer output signals of said cascade of said elements, in the output signal received at said input of said frequency detector means, consequent to said frequency shifts produced in said LCF signals by said feedback signal, is a net frequency shift of substantially zero; so that the net shift of frequency, consequent to said feedback signal, of each converted component of said FM signal, at said input of said frequency detector means, is substantially zero; wherein said intermediate point at which said bandwidth-window filter means is included is selected whereby in consequence of said feedback signal, there results a shift of overall filtering response, between said signal input of said first mixer means and said input of said frequency detector means; and wherein said control loop is arranged to cause the shifting bandwidth window of said overall filtering response to substantially track the instantaneous carrier frequency of said FM signal, further adapted to sustain extension of FM threshold at modulation frequencies of pulse modulation; wherein a modulation component of said FM signal comprises encoding pulses; comprising carrier-tracking demodulating the deviation band inclusive of the said modulation component; utilizing feedback adapted to sustain the low-modulation-frequency threshold extension, produced by said carrier-tracking demodulating, at the higher modulation frequencies; characterized in that the said feedback is arranged to sustain the said threshold extension at the modulation frequency spectrum of said encoding pulses.

14. An FM demodulator system according to claim 13, wherein said feedback comprises providing a low feedback-loop phase delay at low modulation frequencies, a region of increased feedback-loop attenuation intermediate the modulation spectrum bandwidth, and a feedback-loop phase delay of about 360 degrees at a frequency higher than the frequency spectrum of said region; and characterized in that the frequency corresponding to the 360 degrees delay is arranged to be within the frequency spectrum of said encoding pulses.

15. In an FM demodulator system, the FM demodulation method, comprising, in combination, the stemps of performing: a plurality of mixing operations; at least one LCG (local-carrier-frequency-generating) operation; each said mixing operation operating on an input signal and a LCF (local-carrier-frequency) signal generated in a said LCG operation, and generating a mixing-operation output signal; said plurality of mixing operations being performed sequentially in a cascade of comprised operations of said FM demodulation method; a first of said plurality of mixing operations being performed in response to an FM signal, each remaining said mixing operation being performed in response to a mixing-operation output signal generated in a preceeding one of said mixing operations; further comprising, in said cascade, a frequency detection operation, performed in response to a mixing-operation output signal generated in a last of said plurality of mixing operations, and providing a system demodulated output signal; further comprising at least one bandwidth-window filtering operation, providing a filtering response characterized by a substantially predetermined center frequency; said bandwidth-window filtering operation being performed at a sequential point intermediate said cascade, in response to a mixing operation output signal generated in a selected one of said mixing operations, and providing a bandwidth-window output signal to be operated on in a subsequent one of said mixing operations; further comprising at least one product selection filtering operation, comprised sequentially in said cascade; each said product selection operation beign performed in response to a mixing-operation output signal generated in a said mixing operation, and providing a product-selection output signal to be operated on in a subsequent comprised operation of said cascade; each said product selection operation operating to pass a selected mixing product comprised in a mixing-operation output signal generated in a preceeding mixing operation, from an input signal operated on in said preceeding mixing operation; at least one said LCG operation comprising a frequency-controlling process for controlling the frequency generated in said LCG operation; further comprising a control-loop operation for generating a feedback signal in accordance with an output signal generated in said frequency detection operation, and providing said feedback signal to be operated on in a said frequency-controlling process comprised in a said LCG operation; wherein, in consequence of said control-loop operation, frequency shifts are generated in the LCF signals to be operated on in at least two of said plurality of mixing operations; wherein the resultant of the frequency shifts of the filtered mixing-operation output signals of said cascade, in the output signal received to be operated on in said frequency detection operation, consequent to said frequency shifts generated in said LCF signals in said control-loop operation, is a net frequency shift of substantially zero; so that the net shift of frequency, consequent to said control-loop operation, of each converted frequency component of said FM signal, which is operated on in said frequency detection operation, is substantially zero; wherein said intermediate sequential point at which said bandwidth-window filtering operation is performed is selected whereby in consequence of said control-loop operation, there results a shift of overall filtering response, as effected between the application of said FM signal to be operated on in said first mixing operation and the generation of the output signal to be operated on in said frequency detection operation; and wherein said control-loop operation is arranged to cause the shifting bandwidth window of said overall filtering response to substantially track the instantaneous carrier frequency of said FM signal; wherein said plurality of mixing operations comprises two mixing operations; a first said mixing operation being performed in response to said FM signal, and said mixing-operation output signal generated in said first mixing operation being operated on in a said bandwidth-width filtering operation; an output signal generated therein being operated on in a second said mixing operation; an output signal generated therein being operated on in a said product selection operation; an output signal generated therein being operated on in a said frequency detection operation; wherein said feedback signal is operated on in a said frequency-controlling process comprised in a first said LCG operation, an output signal generated therein being operated on as an LCF signal in said second mixing operation; further comprising a third mixing operation for generating a difference-frequency output signal, in response to the difference frequency between the instantaneous frequency of said LCF signal generated in said first LCG operation and the frequency of an output signal generated in a comprised second said LCG operation for effecting tuning of said FM signal; an output signal generated in said third mixing operation being operated on in a difference-frequency-responsive filtering operation responsive to said difference frequency; an output signal generated in said difference-frequency-responsive operation being operated on as an LCF signal in said first mixing operation; wherein the center frequency of the output signal generated in said first LCG operation is less than the frequency of the output signal generated in said second LCG operation, said frequency being less than the carrier frequency of said FM signal; and wherein the filtering response of said bandwidth-window filtering operation passes at least the difference frequency between the center carrier frequency of said FM signal and the center frequency of said output signal generated in said difference-frequency-responsive operation; said product selecting operation operating to pass a band of difference frequencies, each frequency of said band being a difference frequency between the instantaneous frequency of the output signal generated in said bandwidth-window filtering operation and the instantaneous frequency of the LCF output signal generated in said first LCG operation.

16. The FM demodulation method according to claim 15, wherein said bandwidth-window filtering operation is an adaptive filtering operation, further comprising a bandwidth-varying process for varying the bandwidth of said filtering response of said bandwidth-window filtering operation in response to the strength of said FM signal, thereby rendering the bandwidth of said bandwidth window of said overall filtering response responsive to said strength of said FM signal.

17. The FM demodulation method according to claim 15, wherein said product selection filtering operation operates to pass a band of frequencies having the bandwidth of said FM signal.

18. The FM demodulation method according to claim 15, further comprising maintaining the center frequency of said output signal generated in said difference-frequency-responsive operation substantially matched to the center frequency of the band of difference frequencies comprised in said output signal generated in said third mixing operation.

19. In an FM demodulator system, the FM demodulation method, comprising, in combination, the steps of performing: a plurality of mixing operations; at least one LCG (local-carrier-frequency-generating) operation; each said mixing operation operating on an input signal and a LCF (local-carrier-frequency) signal generated in a said LCG operation, and generating a mixing-operation output signal; said plurality of mixing operations being performed sequentially in a cascade of comprised operations of said FM demodulation method; a first of said plurality of mixing operations being performed in response to an FM signal, each remaining said mixing operation being performed in response to a mixing-operation output signal generated in a preceeding one of said mixing operations; further comprising, in said cascade, a frequency detection operation, performed in response to a mixing-operation output signal generated in a last of said plurality of mixing operations, and providing a system demodulated output signal; further comprising at least one bandwidth-window filtering operation, providing a filtering response characterized by a substantially predetermined center frequency; said bandwidth-window filtering operation being performed at a sequential point intermediate said cascade, in response to a mixing operation output signal generated in a selected one of said mixing operations, and providing a bandwidth-window output signal to be operated on in a subsequent one of said mixing operations; further comprising at least one product selection filtering operation, comprised sequentially in said cascade; each said product selection operation being performed in response to a mixing-operation output signal generated in a said mixing operation, and providing a product-selection output signal to be operated on in a subsequent comprised operation of said cascade; each said product selection operation operating to pass a selected mixing product comprised in a mixing-operation output signal generated in a preceeding mixing operation, from an input signal operated on in said preceeding mixing operation; at least one said LCG operation comprising a frequency-controlling process for controlling the frequency generated in said LCG operation; further comprising a control-loop operation for generating a feedback signal in accordance with an output signal generated in said frequency detection operation, and providing said feedback signal to be operated on in a said frequency-controlling process comprised in a said LCG operation; wherein, in consequence of said control-loop operation, frequency shifts are generated in the LCF signals to be operated on in at least two of said plurality of mixing operations; wherein the resultant of the frequency shifts of the filtered mixing-operation output signals of said cascade, in the output signal received to be operated on in said frequency detection operation, consequent to said frequency shifts generated in said LCF signals in said control-loop operation, is a net frequency shift of substantially zero; so that the net shift of frequency, consequent to said control-loop operation, of each converted frequency component of said FM signal, which is operated on in said frequency detection operation, is substantially zero; wherein said intermediate sequential point at which said bandwidth-window filtering operation is performed is selected whereby in consequence of said control-loop operation, there results a shift of overall filtering response, as effected between the application of said FM signal to be operated on in said first mixing operation and the generation of the output signal to be operated on in said frequency detection operation; and wherein said control-loop operation is arranged to cause the shifting bandwidth window of said overall filtering response to substantially track the instantaneous carrier frequency of said FM signal; wherein said plurality of mixing operations comprises two mixing operations; a first said mixing operation being performed in response to said FM signal; said mixing-operation output signal generated in said first mixing operation being operated on in a said bandwidth-window filtering operation; an output signal generated therein being operated on in a second said mixing operation; an output signal generated therein being operated on in a said product selection operation; an output signal generated therein being operated on in a said frequency detection operation; wherein said feedback signal is operated on in a said frequency-controlling process comprised in a said LCG operation for generating an output signal to be operated on as an LCF signal in said first and second mixing operations; and output signal generated in said LCG operation being operated on as an LCF signal in both said first mixing operation and in said second mixing operation; wherein the filtering response of said bandwidth-window filtering operation passes at least the sum frequency of the center frequency of the output signal generated in said LCG operation and the center carrier frequency of said FM signal; wherein said product selection operation operates to pass a band of difference frequencies, each frequency of said band being a difference frequency between the instantaneous frequency of said output signal generated in said bandwidth-window filtering operation and said instantaneous frequency of said output signal generated in said LCG operation; wherein said bandwidth-window filtering operation is an adaptive filtering operation, further comprising a bandwidth-varying process for varying the bandwidth of said filtering response of said bandwidth-window filtering operation in response to the strength of said FM signal, thereby rendering the bandwidth of said bandwidth window of said overall filtering response responsive to said strength of said FM signal.

20. In an FM demodulator system, the FM demodulator method, comprising, in combination, the steps of performing: a plurality of mixing operations; at least one LCG (local-carrier-frequency-generating) operation; each said mixing operation operating on an input signal and a LCF (local-carrier-frequency) signal generated in a said LCG operation, and generating a mixing-operation output signal; said plurality of mixing operations being performed sequentially in a cascade of comprised operations of said FM demodulation method; a first of said plurality of mixing operations being performed in response to an FM signal, each remaining said mixing operation being performed in response to a mixing-operation output signal generated in a preceeding one of said mixing operations; further comprising, in said cascade, a frequency detection operation, performed in response to a mixing-operation output signal generated in a last of said plurality of mixing operations, and providing a system demodulated output signal; further comprising at least one bandwidth-window filtering operation, providing a filtering response characterized by a substantially predetermined center frequency; said bandwidth-window filtering operation being performed at a sequential point intermediate said cascade, in response to a mixing operation output signal generated in a selected one of said mixing operations, and providing a bandwidth-window output signal to be operated on in a subsequent one of said mixing operations; further comprising at least one product selection filtering operation, comprised sequentially in said cascade; each said product selection operation being performed in response to a mixing-operation output signal generated in a said mixing operation, and providing a product-selection output signal to be operated on in a subsequent comprised operation of said cascade; each said product selection operation operating to pass a selected mixing product comprised in a mixing-operation output signal generated in a preceeding mixing operation, from an input signal operated on in said preceeding mixing operation; at least one said LCG operation comprising a frequency-controlling process for controlling the frequency generated in said LCG operation; further comprising a control-loop operation for generating a feedback signal in accordance with an output signal generated in said frequency detection operation, and providing said feedback signal to be operated on in a said frequency-controlling process comprised in a said LCG operation; wherein, in consequence of said control-loop operation, frequency shifts are generated in the LCF signals to be operated on in at least two of said plurality of mixing operations; wherein the resultant of the frequency shifts of the filtered mixing-operation output signals of said cascade, in the output signal received to be operated on in said frequency detection operation, consequent to said frequency shifts generated in said LCF signals in said control-loop operation, is a net frequency shift of substantially zero; so that the net shift of frequency, consequent to said control-loop operation, of each converted frequency component of said FM signal, which is operated on in said frequency detection operation, is substantially zero; wherein said intermediate sequential point at which said bandwidth-window filtering operation is performed is selected whereby in consequence of said control-loop operation, there results a shift of overall filtering response, as effected between the application of said FM signal to be operated on in said first mixing operation and the generation of the output signal to be operated on in said frequency detection operation; and wherein said control-loop operation is arranged to cause the shifting bandwidth window of said overall filtering response to substantially track the instantaneous carrier frequency of said FM signal; wherein said plurality of mixing operations comprises four mixing operations; a first said mixing operation being performed in response to said FM signal; said mixing operation output signal generated in said first mixing operation being operated on in a first said bandwidth-window filtering operation; an output signal generated therein being operated on in a second side mixing operation; an output signal generated therein being operated on in a first said product selection operation; an output signal generated therein being operated on in a third said mixing operation; an output signal generated therein being operated on in a second said bandwidth-window filtering operation; and output signal generated therein being operated on in a fourth said mixing operation; an output signal generated therein being operated on in a second said product selection operation; an output signal generated therein being operated on in a said frequency detection operation; wherein said feedback signal is operated on via a first combining operation, in a frequency-controlling process comprised in a first said LCG operation for generating an output signal to be operated on as an LCF signal in said first and second mixing operations; and wherein said feedback signal is operated on via a second combining operation in a said frequency-controlling operation comprised in a second said LCG operation for generating an output signal to be operated on as an LCF signal in said third and fourth mixing operations; said first combining operation being adapted to generate an output signal in combined response to said feedback signal and to a signal representative of the strength of said FM signal; and said second combining operation being adapted to generate an output signal in combined response to said feedback signal and to the polarity-inverse of said signal representative of said strength of said FM signal; said output signal generated in said first combining operation being operated on in said frequency-controlling process comprised in said first LCG operation, an output signal generated therein being operated on as an LCF signal in both said first and second mixing operations; said output signal generated in said second combining operation being operated on in said frequency-controlling process comprised in said second LCG operation, an output signal generated therein being operated on as an LCF signal in both said third and fourth mixing operations; wherein the filtering response of said first bandwidth-window filtering operation passes at least the sum frequency of the center output frequency generated in said first LCG operation and the center carrier frequency of said FM signal; said first product selection operation operating to pass a band of difference frequencies, each frequency of said band being a difference frequency between the instantaneous output frequency generated in said first bandwidth-window filtering operation and the instantaneous output frequency generated in said first LCG operation; wherein the filtering response of said second bandwidth-window filtering operation passes at least the sum frequency of the center output frequency generated in said second LCG operation and said center carrier frequency of said FM signal; said second product selection operation operating to pass a band of difference frequencies, each frequency of said band being a difference frequency between the instantaneous output frequency generated in said second bandwidth-window filtering operation and the instantaneous output frequency generated in said second LCG operation; whereby the bandwidth of said overall filtering response is rendered responsive to said signal representative of said FM signal, and hence to said strength of said FM signal.

21. The FM demodulation method according to claim 20, wherein the center frequencies of the output signals generated in said first and second LCG operations are substantially equal.

22. In an FM demodulator system, the FM demodulator method, comprising, in combination, the steps of performing: a plurality of mixing operations; at least one LCG (local-carrier-frequency-generating) operation; each said mixing operation operating on an input signal and a LCF (local-carrier-frequency) signal generated in a said LCG operation, and generating a mixing-operation output signal; said plurality of mixing operations being performed sequentially in a cascade of comprised operations of said FM demodulation method; a first of said plurality of mixing operations being performed in response to an FM signal, each remaining said mixing operation being performed in response to a mixing-operation output signal generated in a preceeding one of said mixing operations; further comprising, in said cascade, a frequency detection operation, performed in response to a mixing-operation output signal generated in a last of said plurality of mixing operations, and providing a system demodulated output signal; further comprising at least one bandwidth-window filtering operation, providing a filtering response characterized by a substantially predetermined center frequency; said bandwidth-window filtering operation being performed at a sequential point intermediate said cascade, in response to a mixing operation output signal generated in a selected one of said mixing operations, and providing a bandwidth-window output signal to be operated on in a subsequent one of said mixing operations; further comprising at least one product selection filtering operation, comprised sequentially in said cascade; each said product selection operation being different from each said bandwidth-window filtering operation; each said product selection operation being performed in response to a mixing-operation output signal generated in a said mixing operation, and providing a product-selection output signal to be operated on in a subsequent comprised operation of said cascade; each said product selection operation operating to pass a selected mixing product comprised in a mixing-operation output signal generated in a preceeding mixing operation, from an input signal operated on in said preceeding mixing operation; each said product selection operation rejecting mixing-operation products deleterious to FM threshold; at least one said LCG operation comprising a frequency-controlling process for controlling the frequency generated in said LCG operation; further comprising a control-loop operation for generating a feedback signal in accordance with an output signal generated in said frequency detection operation, and providing said feedback signal to be operated on in a said frequency-controlling process comprised in a said LCG operation; wherein, in consequence of said control-loop operation, frequency shifts are generated in the LCF signals to be operated on in at least two of said plurality of mixing operations; wherein the resultant of the frequency shifts of the filtered mixing-operation output signals of said cascade, in the output signal received to be operated on in said frequency detection operation, consequent to said freqency shifts generated in said LCF signals in said control-loop operation, is a net frequency shift of substantially zero; so that the net shift of frequency, consequent to said control-loop operation, of each converted frequency component of said FM signal, which is operated on in said frequency detection operation, is substantially zero; wherein said intermediate sequential point at which said bandwidth-window filtering operation is performed is selected whereby in consequence of said control-loop operation, there results a shift of overall filtering response, as effected between the application of said FM signal to be operated on in said first mixing operation and the generation of the output signal to be operated on in said frequency detection operation; and wherein said control-loop operation is arranged to cause the shifting bandwidth window of said overall filtering response to substantially track the instantaneous carrier frequency of said FM signal, wherein said bandwidth-window filtering operation is an adaptive filtering operation, further comprising a bandwidth-varying process for varying the bandwidth of said filtering response of said bandwidth-window filtering operation in response to at least one chosen parameter of said FM signal, thereby rendering the bandwidth of said bandwidth window of said overall filtering response responsive to said parameter of said FM signal.

23. In an FM demodulator system, the FM demodulation method, comprising, in combination, the steps of performing: a plurality of mixing operations; at least one LCG (local-carrier-frequency-generating) operation; each said mixing operation operating on an input signal and a LCF (local-carrier-frequency) signal generated in a said LCG operation, and generating a mixing-operation output signal; said plurality of mixing operations being performed sequentially in a cascade of comprised operations of said FM demodulation method; a first of said plurality of mixing operations being performed in response to an FM signal, each remaining said mixing operation being performed in response to a mixing-operation output signal generated in a preceeding one of said mixing operations; further comprising, in said cascade, a frequency detection operation, performed in response to a mixing-operation output signal generated in a last of said plurality of mixing operations, and providing a system demodulated output signal; further comprising at least one bandwidth-window filtering operation, providing a filtering response characterized by a substantially predetermined center frequency; said bandwidth-window filtering operation being performed at a sequential point intermediate said cascade, in response to a mixing operation output signal generated in a selected one of said mixing operations, and providing a bandwidth-window output signal to be operated on in a subsequent one of said mixing operations; further comprising at least one product selection filtering operation, comprised sequentially in said cascade; each said product selection operation being different from each said bandwidth-window filtering operation; each said product selection operation being performed in response to a mixing-operation output signal generated in a said mixing operation, and providing a product-selection output signal to be operated on in a subsequent comprised operation of said cascade; each said product selection operation operating to pass a selected mixing product comprised in a mixing-operation output signal generated in a preceeding mixing operation, from an input signal operated on in said preceeding mixing operation; each said product selection operation rejecting mixing-operation products deleterious to FM threshold; at least one said LCG operation comprising a frequency-controlling process for controlling the frequency generated in said LCG operation; further comprising a control-loop operation for generating a feedback signal in accordance with an output signal generated in said frequency detection operation, and providing said feedback signal to be operated on in a said frequency-controlling process comprised in a said LCG operation; wherein, in consequence of said control-loop operation, frequency shifts are generated in the LCF signals to be operated on in at least two of said plurality of mixing operations; wherein the resultant of the frequency shifts of the filtered mixing-operation output signals of said cascade, in the output signal received to be operated on in said frequency detection operation, consequent to said frequency shifts generated in said LCF signals in said control-loop operation, is a net frequency shift of substantially zero; so that the net shift of frequency, consequent to said control-loop operation, of each converted frequency component of said FM signal, which is operated on in said frequency detection operation, is substantially zero; wherein said intermediate sequential point at which said bandwidth-window filtering operation is performed is selected whereby in consequence of said control-loop operation, there results a shift of overall filtering response, as effected between the application of said FM signal to be operated on in said first mixing operation and the generation of the output signal to be operated on in said frequency detection operation; and wherein said control-loop operation is arranged to cause the shifting bandwidth window of said overall filtering response to substantially track the instantaneous carrier frequency of said FM signal, wherein said plurality of mixing operations comprises two mixing operations; a first said mixing operation being performed in response to said FM signal, and said mixing-operation output signal generated in said first mixing operation being operated on in a said bandwidth-window filtering operation; an output signal generated therein being operated on in a second said mixing operation; an output signal generated therein being operated on in a said frequency detection operation; wherein said feedback signal is operated on in a said frequency-controlling process comprised in a first said LCG operation, an output signal generated therein being operated on as an LCF signal in said second mixing operation; further comprising a third mixing operation for generating an output frequency, in response to the instantaneous frequency of said LCF signal generated in said first LCG operation and the frequency of an output signal generated in a comprised second said LCG operation for effecting tuning of said FM signal; an output signal generated in said third mixing operation being operated on in a third-mixing-operation-frequency-responsive filtering operation responsive to said output frequency; an output signal generated in said third-mixing-operation-frequency-responsive operation being operated on as an LCF signal in said first mixing operation.

24. The FM demodulation method according to claim 23, wherein said output signal generated in said second mixing operation is operated on in a said product selection operation; said product selection operation operating to pass a band of second-mixing-operation-output frequencies and to exclude spurious output products, deleterious to FM threshold, of said second mixing operation.

25. In an FM demodulator system, the FM demodulation method, comprising, in combination, the steps of performing: a plurality of mixing operations; at least one LCG (local-carrier-frequency-generating) operation; each said mixing operation operating on an input signal and a LCF (local-carrier-frequency) signal generated in a said LCG operation, and generating a mixing-operation output signal; said plurality of mixing operations being performed sequentially in a cascade of comprised operations of said FM demodulation method; a first of said plurality of mixing operations being performed in response to an FM signal, each remaining said mixing operation being performed in response to a mixing-operation output signal generated in a preceeding one of said mixing operations; further comprising, in said cascade, a frequency detection operation, performed in response to a mixing-operation output signal generated in a last of said plurality of mixing operations, and providing a system demodulated output signal; further comprising at least one bandwidth-window filtering operation, providing a filtering response characterized by a substantially predetermined center frequency; said bandwidth-window filtering operation being performed at a sequential point intermediate said cascade, in response to a mixing operation output signal generated in a selected one of said mixing operations, and providing a bandwidth-window output signal to be operated on in a subsequent one of said mixing operations; further comprising at least one product selection filtering operation, comprised sequentially in said cascade; each said product selection operation being different from each said bandwidth-window filtering operation; each said product selection operation being performed in response to a mixing-operation output signal generated in a said mixing operation, and providing a product-selection output signal to be operated on in a subsequent comprised operation of said cascade; each said product selection operation operating to pass a selected mixing product comprised in a mixing-operation output signal generated in a preceeding mixing operation, from an input signal operated on in said preceeding mixing operation; each said product selection operation rejecting mixing-operation products deleterious to FM threshold; at least one said LCG operation comprising a frequency-controlling process for controlling the frequency generated in said LCG operation; further comprising a control-loop operation for generating a feedback signal in accordance with an output signal generated in said frequency detection operation, and providing said feedback signal to be operated on in a said frequency-controlling process comprised in a said LCG operation; wherein, in consequence of said control-loop operation, frequency shifts are generated in the LCF signals to be operated on in at least two of said plurality of mixing operations; wherein the resultant of the frequency shifts of the filtered mixing-operation output signals of said cascade, in the output signal received to be operated on in said frequency detection operation, consequent to said frequency shifts generated in said LCF signals in said control-loop operation, is a net frequency shift of substantially zero; so that the net shift of frequency, consequent to said control-loop operation, of each converted frequency component of said FM signal, which is operated on in said frequency detection operation, is substantially zero; wherein said intermediate sequential point at which said bandwidth-window filtering operation is performed is selected whereby in consequence of said control-loop operation, there results a shift of overall filtering response, as effected between the application of said FM signal to be operated on in said first mixing operation and the generation of the output signal to be operated on in said frequency detection operation; and wherein said control-loop operation is arranged to cause the shifting bandwidth window of said overall filtering response to substantially track the instantaneous carrier frequency of said FM signal, wherein said plurality of mixing operations comprises four mixing operations; a first said mixing operation being performed in response to said FM signal; said mixing operation output signal generated in said first mixing operation being operated on in a first said bandwidth-window filtering operation; an output signal generated therein being operated on in a second said mixing operation; an output signal generated therein being operated on in a third said mixing operation; an output signal generated therein being operated on in a second said bandwidth-window filtering operation; an output signal generated therein being operated on in a fourth said mixing operation; an output signal generated therein being operated on in a said frequency detection operation; wherein said feedback signal is operated on via a first combining operation, in a frequency-controlling process comprised in a first said LCG operation for generating an output signal to be operated on as an LCF signal in said first and second mixing operations; and wherein said feedback signal is operated on via a second combining operation in a said frequency-controlling operation comprised in a second said LCG operation for generating an output signal to be operated on as an LCF signal in said third and fourth mixing operations; said first combining operation being adapted to generate an output signal in combined response to said feedback signal and to a signal representative of at least one chosen parameter of said FM signal; and said second combining operation being adapted to generate an output signal in combined response to said feedback signal and to the polarity-inverse of said signal representative of said parameter of said FM signal; said output signal generated in said first combining operation being operated on in said frequency-controlling process comprised in said first LCG operation, an output signal generated therein being operated on as an LCF signal in both said first and second mixing operations; said output signal generated in said second combining operation being operated on in said frequency-controlling process comprised in said second LCG operation, an output signal generated therein being operated on as an LCF signal in both said third and fourth mixing operations; whereby the bandwidth of said overall filtering response is rendered responsive to said signal representative of said parameter of said FM signal, and hence to said parameter of said FM signal.

26. The FM demodulation method according to claim 25, wherein said output signal generated in said second mixing operation is operated on in a first said product selection operation; an output signal generated therein being operated on in said third mixing operation; an output signal generated in said fourth mixing operation being operated on in a second said product selection operation; an output signal generated therein being operated on in said frequency detection operation; said first product selection operation operating to pass a band of second-mixing-operation-output frequencies and to exclude spurious output products, deleterious to FM threshold, of said second mixing operation; said second product selection operation operating to pass a band of fourth-mixing-operation-output frequencies and to exclude spurious output products, deleterious to FM threshold, of said fourth mixing operation.

27. In an FM demodulator system, the FM demodulation method, comprising, in combination, the steps of performing: a plurality of mixing operations; at least one LCG (local-carrier-frequency-generating) operation; each said mixing operation operating on an input signal and a LCF (local-carrier-frequency) signal generated in a said LCG operation, and generating a mixing-operation output signal; said plurality of mixing operations being performed sequentially in a cascade of comprised operations of said FM demodulation method; a first of said plurality of mixing operations being performed in response to an FM signal, each remaining said mixing operation being performed in response to a mixing-operation output signal generated in a preceeding one of said mixing operations; further comprising, in said cascade, a frequency detection operation, performed in response to a mixing-operation output signal generated in a last of said plurality of mixing operations, and providing a system demodulated output signal; further comprising at least one bandwidth-window filtering operation, providing a filtering response characterized by a substantially predetermined center frequency; said bandwidth-window filtering operation being performed at a sequential point intermediate said cascade, in response to a mixing operation output signal generated in a selected one of said mixing operations, and providing a bandwidth-window output signal to be operated on in a subsequent one of said mixing operations; further comprising at least one product selection filtering operation, comprised sequentially in said cascade; each said product selection operation being different from each said bandwidth-window filtering operation; each said product selection operation being performed in response to a mixing-operation output signal generated in a said mixing operation, and providing a product-selection output signal to be operated on in a subsequent comprised operation of said cascade; each said product selection operation operating to pass a selected mixing product comprised in a mixing-operation output signal generated in a preceeding mixing operation, from an input signal operated on in said preceeding mixing operation; each said product selection operation rejecting mixing-operation products deleterious to FM threshold; at least one said LCG operation comprising a frequency-controlling process for controlling the frequency generated in said LCG operation; further comprising a control-loop operation for generating a feedback signal in accordance with an output signal generated in said frequency detection operation, and providing said feedback signal to be operated on in a said frequency-controlling process comprised in a said LCG operation; wherein, in consequence of said control-loop operation, frequency shifts are generated in the LCF signals to be operated on in at least two of said plurality of mixing operations; wherein the resultant of the frequency shifts of the filtered mixing-operation output signals of said cascade, in the output signal received to be operated on in said frequency detection operation, consequent to said frequency shifts generated in said LCF signals in said control-loop operation, is a net frequency shift of substantially zero; so that the net shift of frequency, consequent to said control-loop operation, of each converted frequency component of said FM signal, which is operated on in said frequency detection operation, is substantially zero; wherein said intermediate sequential point at which said bandwidth-window filtering operation is performed is selected whereby in consequence of said control-loop operation, there results a shift of overall filtering response, as effected between the application of said FM signal to be operated on in said first mixing operation and the generation of the output signal to be operated on in said frequency detection operation; and wherein said control-loop operation is arranged to cause the shifting bandwidth window of said overall filtering response to substantially track the instantaneous carrier frequency of said FM signal, further adapted to sustain extension of FM threshold at modulation frequencies of pulse modulation; wherein a modulation component of said FM signal comprises encoding pulses; comprising carrier-tracking demodulating the deviation band inclusive of the said modulation component; utilizing feedback adapted to sustain the low-modulation-frequency threshold extension, produced by said carrier-tracking demodulating, at the higher modulation frequencies; characterized in that the said feedback is arranged to sustain the said threshold extension at the modulation frequency spectrum of said encoding pulses.

28. The FM demodulation method according to claim 27, wherein said feedback comprises providing a low feedback-loop phase delay at low modulation frequencies, a region of increased feedback-loop attenuation intermediate the modulation spectrum bandwidth, and a feedback-loop phase delay of about 360 degrees at a frequency higher than the frequency spectrum of said region; and characterized in that the frequency corresponding to the 360 degrees delay is arranged to be within the frequency spectrum of said encoding pulses.

* * * * *

UNITED STATES PATENT AND TRADEMARK OFFICE
CERTIFICATE OF CORRECTION

PATENT NO. : 4,777,449

DATED : October 11, 1988

INVENTOR(S) : Edward O'Connor

It is certified that error appears in the above-identified patent and that said Letters Patent is hereby corrected as shown below:

Column 3, line 23, "as" should be --an--.
Column 7, line 34, "fitler" should be --filter--.
Column 12, line 31, "frequeny" should be --frequency--.
Column 17, line 19, after "system" insert --comprising--.
Column 17, line 52, "genrated" should be --generated--.
Column 19, line 18, after "signal" insert --,--.
Column 19, line 44, "said frequency detector" should be --a said product selector--.
Column 19, line 44, ";" should be --,--.
Column 21, line 37, "modulator" should be --demodulator--,
Column 21, line 56, "bandwisth" should be --bandwidth--.
Column 22, line 57, "stemps" should be --steps--.
Column 23, line 18, "beign" should be --being--.
Column 26, lines 30/31, after "the FM", "demodulator" should be --demodulation--.
Column 27, line 46, "and" should be --an--.
Column 28, lines 41/42, after "the FM", "demodulator" should be --demodulation--.
Column 9, line 28, "since" should be omitted.
Column 11, line 61, after "such" insert --product selector--.

Signed and Sealed this

Twenty-fourth Day of January, 1989

Attest:

DONALD J. QUIGG

Attesting Officer     Commissioner of Patents and Trademarks